United States Patent [19]
Horne et al.

[11] Patent Number: 5,615,217
[45] Date of Patent: Mar. 25, 1997

[54] BOUNDARY-SCAN BYPASS CIRCUIT FOR INTEGRATED CIRCUIT ELECTRONIC COMPONENT AND CIRCUIT BOARDS INCORPORATING SUCH CIRCUITS AND COMPONENTS

[75] Inventors: Rick L. Horne, Boynton Beach; Terence J. Lohman, Boca Raton, both of Fla.; Mark G. Noll, Raleigh, N.C.; Jose A. Olive, Miami; Roberto V. Perez, Boca Raton, both of Fla.

[73] Assignee: International Business Machines Corporation, Armonk, N.Y.

[21] Appl. No.: 352,080

[22] Filed: Dec. 1, 1994

[51] Int. Cl.$^6$ .................................. G01R 31/28
[52] U.S. Cl. ........................................ 371/22.3
[58] Field of Search ............................ 371/15.1, 22.1, 371/22.3, 22.5, 22.6, 25.1, 27; 324/73.1, 158.1, 763, 500, 537; 364/570; 365/189.01, 201

[56] References Cited

U.S. PATENT DOCUMENTS

| | | | |
|---|---|---|---|
| 5,109,190 | 4/1992 | Sakashita et al. | 324/158 R |
| 5,387,862 | 2/1995 | Parker et al. | 324/158.1 |
| 5,428,624 | 6/1995 | Blair et al. | 371/22.3 |
| 5,448,575 | 9/1995 | Hashizume | 371/22.3 |
| 5,450,415 | 9/1995 | Kamada | 371/22.3 |

OTHER PUBLICATIONS

IEEE Std 1149.1–1990, IEEE Standard Test Access Port and Boundary–Scan Architecture, Institute of Electrical and Electronics Engineers, Inc., (May 21, 1990), Chapter 1, pp. 1-1 to 1-5.

Primary Examiner—Robert W. Beausoliel, Jr.
Assistant Examiner—Stephen C. Elmore

[57] ABSTRACT

A method and apparatus for bypassing a boundary-scan cell during functional operation of an electronic component provides a component output signal (such as a data signal) to a boundary-scan bypass circuit during normal functional operation of the electronic component. The component output signal is multiplexed in the bypass circuit with the test result signal that occurs during boundary-scan testing. During functional operation of the electronic component, the component output signal is selected and provided to an output latch that is clocked by a transition of the clock signal of the electronic component. By bypassing the component output signal around the boundary-scan cell during normal operation, the traversing of the multiplexer by the component output signal after the transition of the clock signal of the component is avoided, thereby reducing off-chip delay.

13 Claims, 5 Drawing Sheets

LEGEND: ☐ BOUNDARY-SCAN CELL

BOUNDARY-SCAN BYPASS CIRCUIT FOR INTEGRATED CIRCUIT ELECTRONIC COMPONENT AND CIRCUIT BOARDS INCORPORATING SUCH CIRCUITS AND COMPONENTS

BACKGROUND OF THE INVENTION

The present invention relates to test logic included in an integrated circuit for testing the interconnections between integrated circuits once they have been assembled onto a printed circuit board or other substrate, for testing the integrated circuit itself, and for observing or modifying circuit activity during the component's normal operation. In particular, the present invention relates to improvements increasing operating speed of boundary-scan architecture.

A product is typically constructed from a collection of components that are mounted on a printed circuit board, each of these components having a plurality of pins that connect the component to the circuit board. An integrated circuit used in a board-level design will normally have an established test methodology for that component. Components could be tested on an automatic test equipment system or by using a self-test procedure embedded in the design.

Once the component has been assembled onto the printed circuit board, access to the normal connections of the assembled circuit is limited. Providing the test data to the component and retrieving test data from the component is therefore difficult after assembly. Normally, an in-circuit test is needed in order to test the component in the same manner as it is tested in isolation.

For allowing test facilities built into the component to be used or to apply pre-existing patterns, test data needs to be conveyed to or from the boundaries of the individual component so that it can be tested as if it was free standing. An accepted method for conveying test data is with a boundary-scan cell coupled with a test access bus.

The conventional boundary-scan technique uses a shift-register stage contained in a boundary-scan cell that is located adjacent each component pin so that signals at the component boundaries can be controlled and observed using scan testing principles. The boundary-scan technique is well-known and is the subject of IEEE Std 1149.1-1990, relating to the IEEE Standard Test Access Port and Boundary-Scan Architecture, *Institute of Electrical and Electronics Engineers,* (May 21, 1990).

In order to test the component, test instructions and associated test data are fed into the component by the boundary-scan cell and, subsequently, the results of the execution of such instructions are read out. All of the information (instructions, test data, and test results) is communicated in a serial format. Typically, the sequence of operations is controlled by a bus master, which can be either automatic test equipment (ATE) or a component that interfaces to a higher-level test bus as a part of a complete system maintenance architecture. Control is achieved through signals applied to the test mode select and test clock inputs of the various components connected to the bus master.

Following execution of the test instruction, the results of the test are examined by shifting the data out of the component using the boundary-scan cell. The boundary-scan cells are connected directly to the connection pins of the individual components so that the test signals into and out of the component pass through the boundary-scan cell.

In conventional designs, the boundary-scan cell also receives the normal functional output data of the component when the cell is connected to an output pin of the component and the component is in the normal operation mode. At this time, the boundary-scan cell is not in the test mode and merely passes through the output data from the component. Since both functional data and test data pass through the boundary-scan cell, conventional boundary-scan cell design includes a multiplexer that selects between: (1) the functional data that is output by the component in normal operation; and (2) the test data output by the component or shifted in by another boundary-scan cell when the component and the boundary-scan cell are in a test mode.

In the normal functional operation of the component, the last functional register stage of the component outputs the data at the rising edge of the component clock signal. The functional data signal must then traverse the multiplexer of the boundary-scan cell before being outputted as the output signal of the component. In normal functional operation of the component, the boundary-scan cell therefore adds an off-chip delay that is equivalent to the multiplexer delay. This added delay can make it impossible for a design implemented in a specific technology to meet signal arrival times, unless the boundary-scan circuitry is completely removed and replaced with other, more costly test methods.

SUMMARY OF THE INVENTION

There is therefore a need for a method and apparatus to reduce the off-chip delay introduced by boundary-scan test circuitry, yet allow the use of boundary-scan circuitry that conforms to the IEEE standard for such circuitry.

This and other needs are met by the present invention which provides a boundary-scan bypass circuit for an electronic component coupled to a boundary-scan cell. The bypass circuit comprises signal selection logic having a first input that receives component output signals from the electronic component, a second input that receives test result signals from the boundary-scan cell, a selection signal input, and a selection logic output. Either the component output signal or the test result signals are output from the selection logic output as a function of a selection signal received at the selection signal input. The bypass circuit also comprises an output stage having an input coupled to the selection logic output, a clock input at which the output stage receives a clock signal from the electronic component, and an output at which the component output signals are produced upon a transition of the clock signal from the electronic component.

The present invention has the advantage of retaining conventional boundary-scan test circuit architecture to perform boundary-scan testing, but reduces the off-chip delay during functional operation of the component caused by the traversing of the functional data through the multiplexer in the boundary-scan cell after the transition of the clock signal from the electronic component. The critical time for outputting data from the component when the component is in the normal functional mode (and the boundary-scan cell is not in a test mode), is the time from when the transition of the component clock signal occurs until the time the functional data is actually produced. The path that the functional data follows after the clock transition is therefore a critical path. The present invention avoids sending the functional data from the component through a multiplexer after a clock transition by the use of the bypass circuitry provided by the invention. This achieves an important reduction in off-chip delay when the component is used in its normal functional manner.

The earlier stated needs are also met by a method of the present invention which selectively bypasses a boundary-scan cell that is coupled to an electronic component. This method comprises the steps of providing an output signal on the electronic component to an input of signal selection logic, the signal selection logic also having another input for receiving a test result signal from the boundary-scan cell. The component output signal to be outputted from the signal selection logic is selected, and is provided from the signal selection logic to an output stage. This output stage is clocked upon a transition of a clock signal of the electronic component such that the component output signal is outputted by the output stage.

This method of the present invention provides the advantage of reduced off-chip delay by performing the selection between the component output signal and the test result signal prior to the clocking of the output stage by a transition of the clock signal of the electronic component. When the clock signal transitions, the component output signal is outputted by the output stage and does not have to pass through a multiplexer which selects the component output signal rather than the test result signal. As stated earlier, the critical time for determining the off-chip delay is the time period from the transition of the clock signal of the component until the component output signal appears at the output of the component. Since the selection between the component output signal and the test signal is performed prior to the clock transition, the component output signal does not pass through the multiplexer after the clock transition, thereby reducing off-chip delay.

Other objects, features, aspects and advantages of the present invention become more apparent from the following detailed description of the present invention when taken in conjunction with the accompanying drawings.

DESCRIPTION OF THE ILLUSTRATIVE EMBODIMENTS

Figure 1:
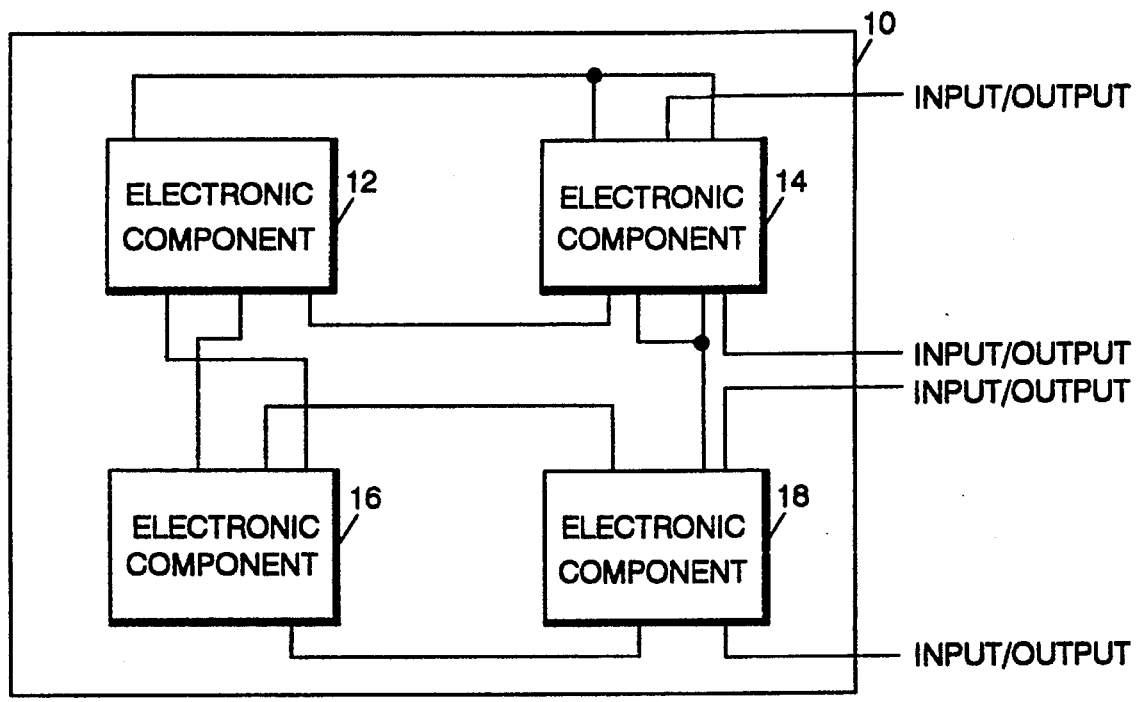
FIG. 1 is a block diagram showing the interconnections between electronic components mounted on a circuit board, as found in the prior art.

FIG. 1 shows in block diagram form a circuit board 10 onto which electronic components (or chips) 12, 14, 16 and 18 are mounted. The components 12–18 are connected to each other through their individual connection pins which serve as inputs and outputs for the components 12–18. Once these components 12–18 have been assembled onto the board 10, it is desirable to confirm (1) that each component 12–18 performs its required function, (2) that the components are interconnected in the correct manner, (3) that the components in the product interact correctly, and (4) that the product performs its intended function. This can be done using boundary-scan architecture. The boundary-scan technique uses a shift-register stage contained in the boundary-scan cell situated adjacent each component pin so that signals at the component boundaries can be controlled and observed using scan testing principles.

Figure 2:
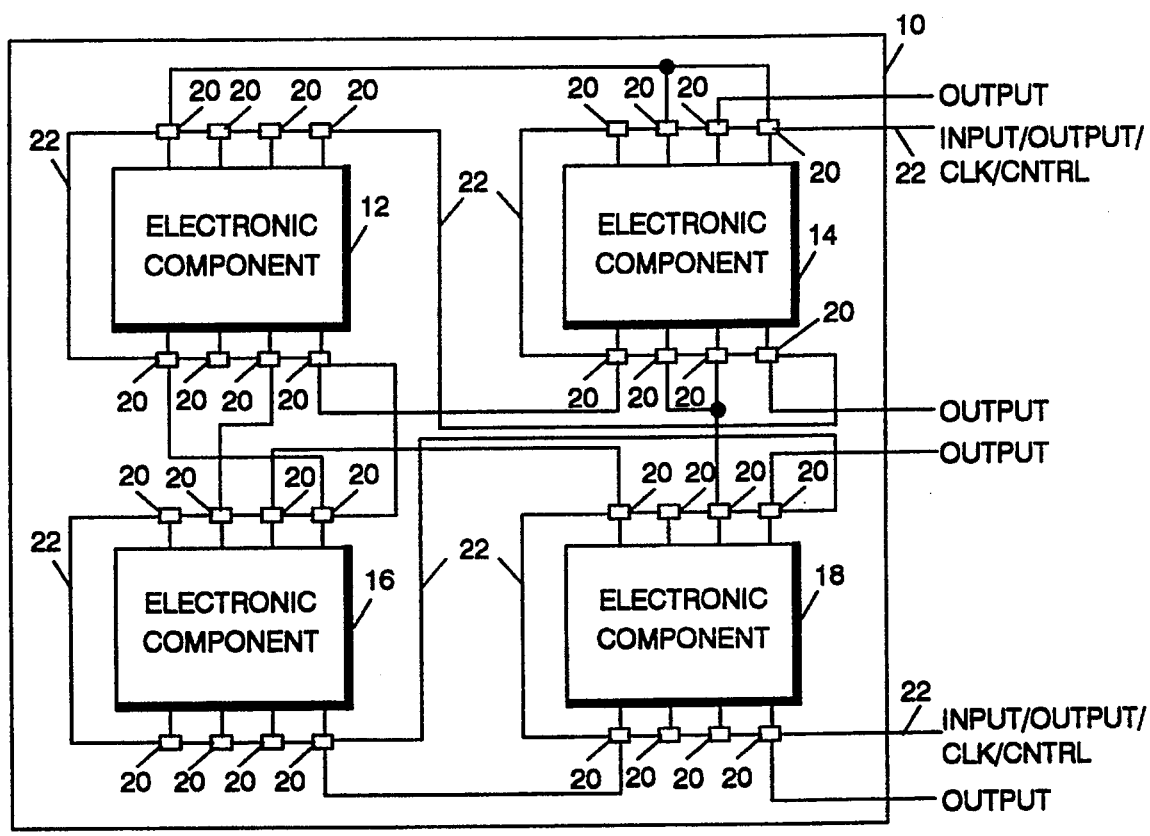
FIG. 2 shows the components mounted on the circuit board as in FIG. 1, but with boundary-scan cells coupled to the connections of the electronic components, as found in the prior art.

FIG. 2 shows the example of components 12–18 mounted on the board 10 from FIG. 1 but with boundary-scan cells 20 located adjacent each component pin of the individual components 12–18. The boundary-scan cells 20 are connected together to form a shift-register chain 22 around the border of the components 12–18, this chain (or path) 22 containing serial input and output connections and carrying the required clock and control signals for boundary-scan testing. Certain ones of the connection pins serve as outputs for the components 12–18, so that during normal operation of the component, functional data will flow through the boundary-scan cell 20. This occurs in the prior art arrangement of FIG. 2, in which the functional data from the component 12 flows through the boundary-scan cells 20.

Figure 3:
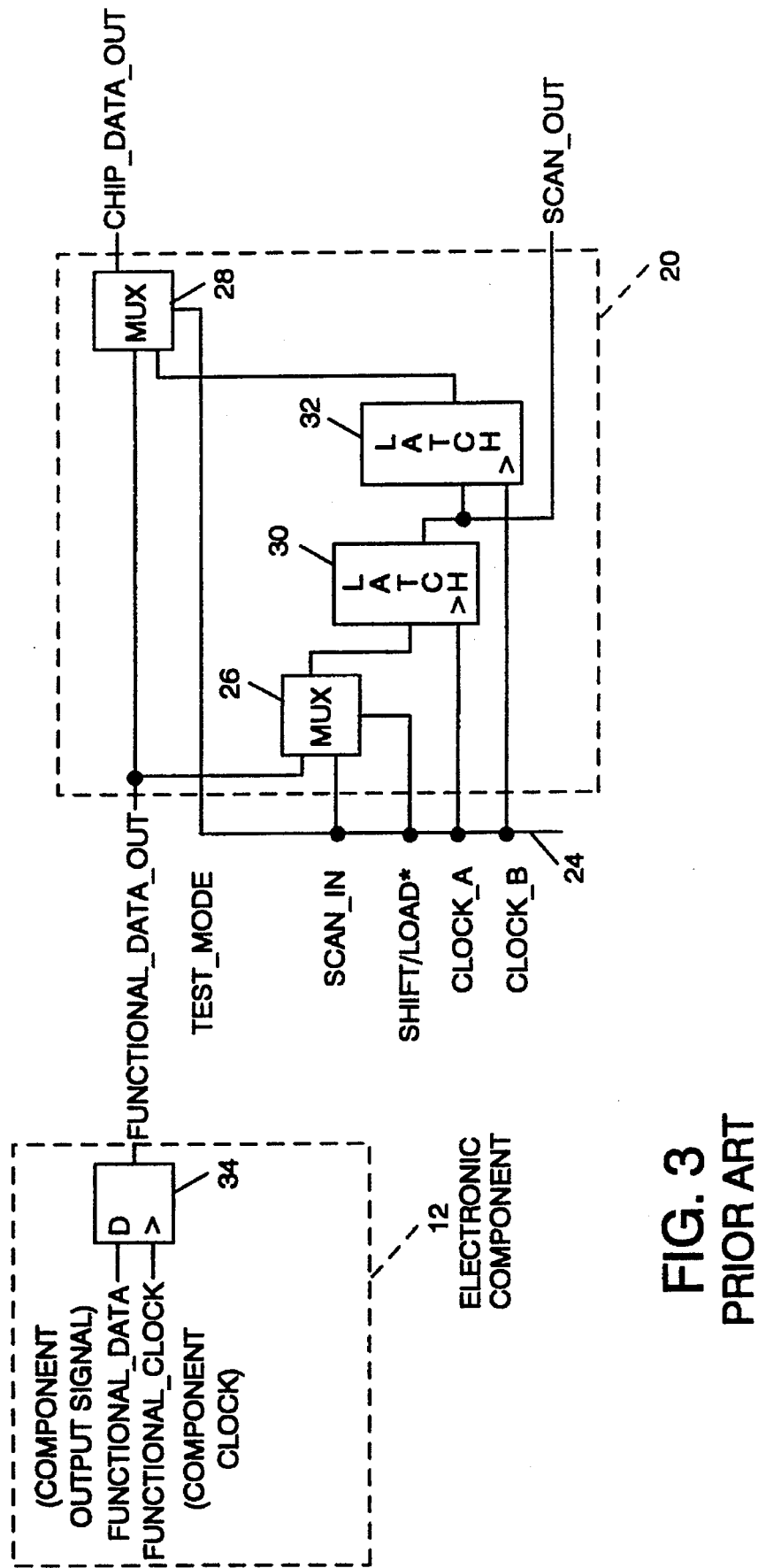
FIG. 3 illustrates a boundary-scan cell of the prior art.

FIG. 3 shows an example of an individual boundary-scan cell 20 of the prior art that is coupled in this case to an output pin of the electronic component 12. Although only one boundary-scan cell 20 is shown connected to component 12, this is for illustration and explanation purposes only. There are normally a plurality of boundary-scan cells 20 coupled to the component 12, as shown in FIG. 2.

Each boundary-scan 20 includes a first multiplexer 26 having an output coupled to a first latch 30 that provides a scan-out signal. This scan-out signal forms a scan-in signal to the next boundary-scan cell 20 along the shift-register chain 22. The output of the first latch 30 is also coupled to the input of a second latch 32. The first and second latches 30, 32 are independently clocked by clock signals A and B received from a test bus 24 that is part of the shift-register chain 22. A second multiplexer 28 receives the signal from the output of the second latch 32 and the functional data signal (the "component output signal") from the last functional register stage 34 of the component 12. The first and second multiplexers 26, 28 multiplex the functional data from the component and the test data in and out of the boundary-scan cell 20. During normal operation (non-test operation), the last functional register stage 34 of the component 12 launches the component output signal at the rising edge of the functional clock signal, this functional clock signal being the clock signal of the component. In this prior art arrangement, the component output signal must then traverse the second multiplexer 28 before it is able to be outputted from the component 12 as a data output signal (CHIP_DATA_OUT). The data output signal therefore has an additional delay with respect to the functional data signal that is equivalent to the delay of the second multiplexer 28. In certain applications, such as for the peripheral component interface (PCI), timing is extremely critical, and the nanoseconds that the second multiplexer 28 consumes is intolerable. The present invention avoids sending the functional data signal through a multiplexer after the clock transition of the component clock signal by bypassing the boundary-scan cell during normal operation.

Figure 4:
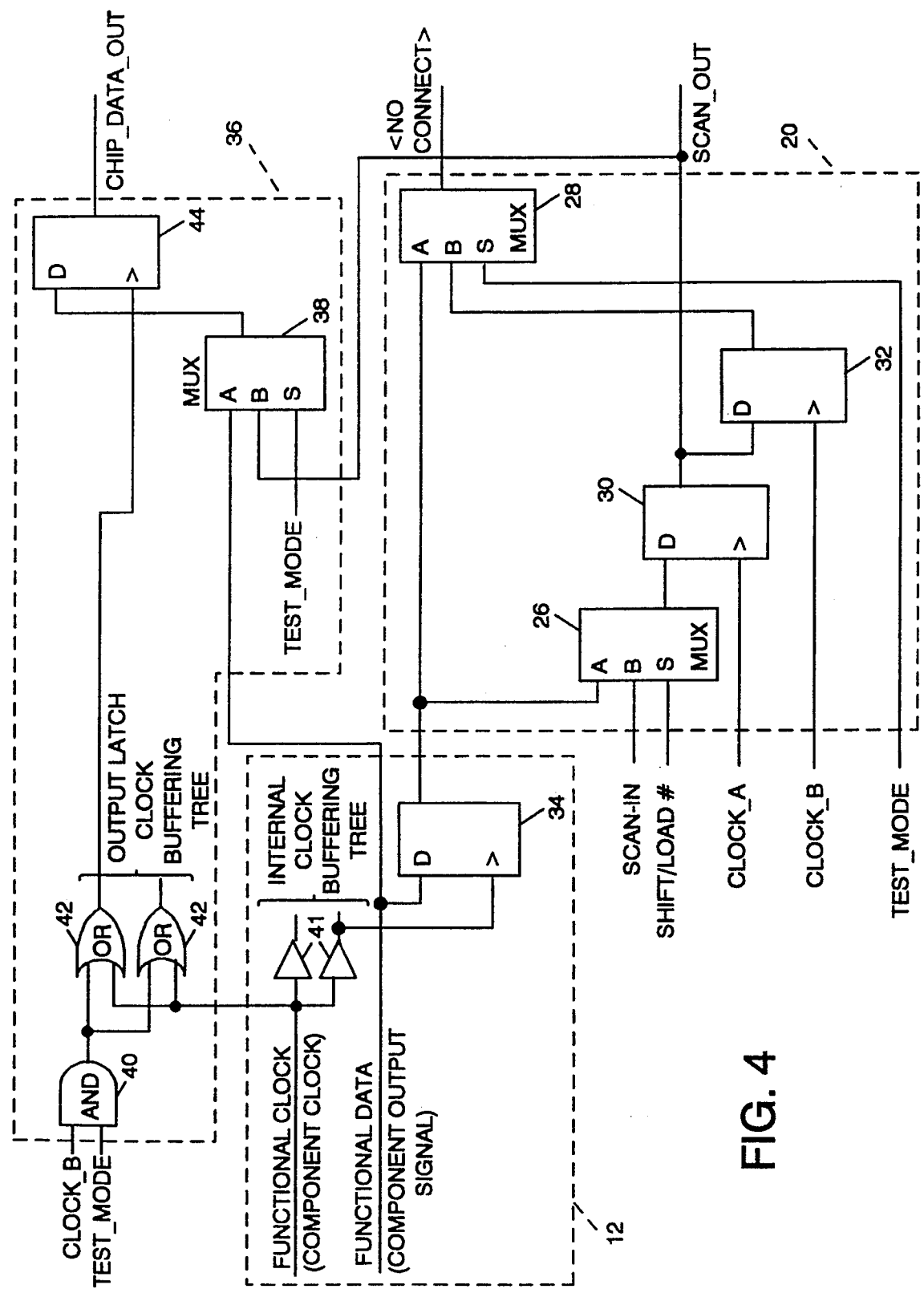
FIG. 4 shows an exemplary embodiment of bypass circuitry of the present invention coupled to a conventional boundary-scan cell and the last functional register stage of an electronic component.

FIG. 4 shows a boundary-scan bypass circuit according to an embodiment of the present invention. The bypass circuit 36 is coupled directly to the component 12, before the last register stage 34, to receive the component output signal of the component 12. The bypass circuit 36 also receives as an input the scan-out signal (the "test result signal") from the boundary-scan cell 20. In the component 12 is an internal clock buffering tree comprising a plurality of gates 41, this internal clock buffering tree also being present in the component 12 of FIG. 2, but not illustrated. These gates 41 drive internal component latches (only latch 34 is shown in FIG. 4). The component clock signal is provided to the bypass circuit 36, as described in more detail below. In FIG. 4, the boundary-scan cell 20 is a conventional boundary-scan cell such as that shown in FIG. 3.

The exemplary embodiment of the bypass circuit 36 shown in FIG. 4 includes a multiplexer 38, an AND gate 40, one or more OR gates 42 forming an output latch clock buffering tree and an output latch 44. The AND gate 40, the OR gate 42 and the output latch 44 can be considered to form an output stage coupled to the multiplexer 38.

The component output signal from the component 12 in normal operation is provided to a first input of the multiplexer 38. The scan-out signal is received by the multiplexer 38 at a second input during boundary-scan testing. The multiplexer 38, which serves as selection logic, receives a scan test mode signal from the test bus 24 as a selection signal input. When the test mode to signal indicates that the boundary-scan cell is in a test mode, the scan-out signal is provided at the output of the multiplexer 38. When the test mode signal indicates that the boundary-scan cell is not in a test mode, (i.e. functional operation) the multiplexer 38 provides the component output signal at the output of the multiplexer 38.

The output latch 44 of the output stage of the bypass circuit 36 receives at one input the output of the multiplexer 38. The output latch 44 also has a clock input which receives one of two different clock signals in dependence on the mode of operation. The clock signal received by the output latch 44 is determined by the AND gate 40 and the OR gate 42. The AND gate 40 receives the test mode signal from the test bus 24 at one input, and a clock signal from the test bus 24 at another input. The output of the AND gate 40 is provided as one of the inputs of the OR gate 42. The other input of the OR gate 42 receives the clock signal of the component 12, this clock signal being supplied from the component before the gates 41 of the internal clock buffering tree.

During normal functional operation of the component 12, the component output signal is provided to the multiplexer 38. Since boundary-scan testing is not occurring at this time, the selection signal input to the multiplexer 38 causes the functional data (the component output signal) to be provided at the output of the multiplexer 38 and to the input of the output latch 44 of the output stage. When the clock signal of the component 12 has a transition, an OR gate 42 passes the component clock signal to the clock input of the output latch 44 which launches the component output signal off-chip.

In the above-described method of operation the component output signal has already passed through the multiplexer 38 when the clock signal of the component undergoes a transition. This avoids the delay that would otherwise be introduced by passing the component output signal through a multiplexer after the edge transition of the clock signal of the component. The only additional delay introduced by the bypass circuit is that of the OR gate 42, which is significantly less than that introduced by a multiplexer.

In the functional mode, the timing improvement realized is equal to the delay of the second multiplexer 28. This is because the delay in the prior art included the delay from the gate 41, the latch 34 and the second multiplexer 28 ($D_{41}+D_{34}+D_{28}$) and the delay of the present invention is the delay from the OR gate 42 and the latch 44 ($D_{42}+D_{44}$). The delay savings is therefore equal to ($D_{41}+D_{34}+D_{28}$)−($D_{42}+D_{44}$). Since the delay of the second multiplexer 28 is equal to the delay of the latch 44 ($D_{28}=D_{44}$) and the delay of the gate 41 is equal to the delay of the OR gate 42 ($D_{41}=D_{42}$), the equation for the delay savings reduces to $D_{28}$, the delay of the second multiplexer 28. This improvement in the delay allows conventional boundary-scan circuitry to be used with applications such as a peripheral component interface in which the timing is extremely critical.

In the boundary-scan test mode, the selection signal input causes the multiplexer 38 to provide the scan-out signal to the input of the output latch 44. The AND gate 40 passes the clock signal from the test bus 24 to the OR gate 42. At this time, the functional clock is zero since boundary-scan testing is occurring. The clock signal from the test bus is provided at the clock input of the output latch 44 and launches scan-out data off-chip.

In the boundary-scan test mode, the functionality of the second latch 32 of the boundary-scan cell 20 is mirrored in the output latch 44. The second latch 32 and the second multiplexer 28 are logically disconnected in the configuration of the present invention.

Figure 5:
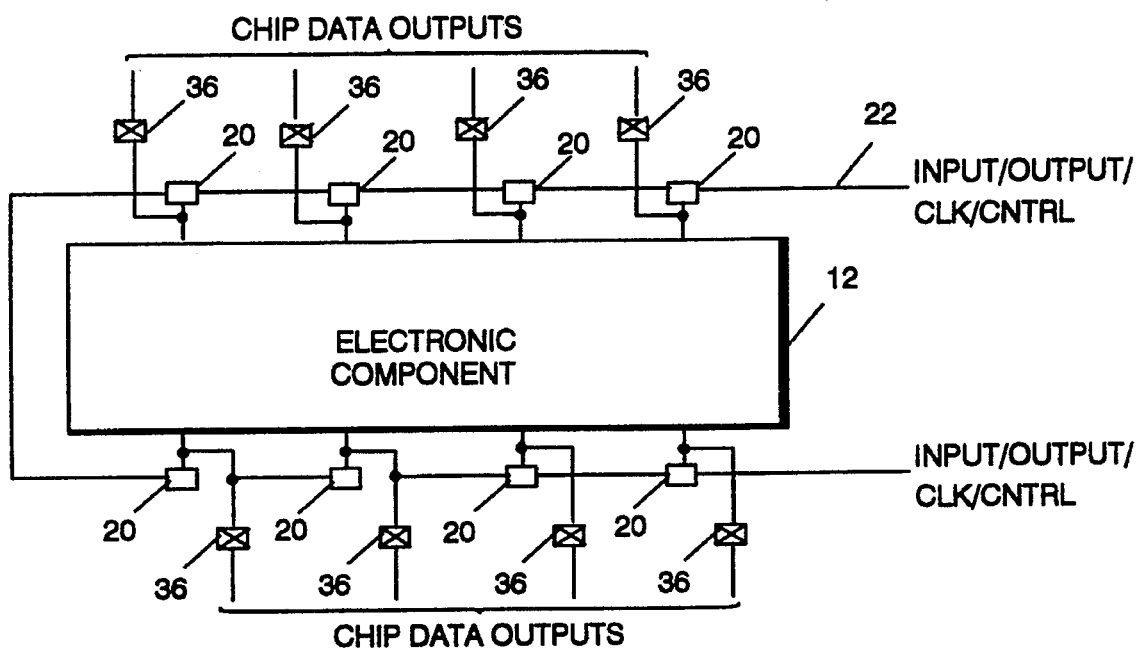
FIG. 5 is an exemplary embodiment of an electrical component coupled to a plurality of boundary-scan cells and bypass circuits of the present invention.

FIG. 5 illustrates in block diagram form the component 12 coupled to a plurality of boundary-scan bypass cells 20 and bypass circuits 36 of the present invention. Each pin of component 12 is provided with bypass circuitry 36 in the illustrated example, although in certain cases pins may not be provided with bypass circuitry if they will not serve as outputs for the component.

Even though specific examples of a boundary-scan cell and a bypass circuit of the present invention have been illustrated, it should be understood that the invention can be utilized with other boundary-scan cells. Also, different embodiments of the bypass circuit of the present invention can be utilized without departing from the present invention. For example, the multiplexer 38 can be replaced by other signal selection logic and the output stage can be configured in a different manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit board comprising:

a printed circuit board substrate;

a component mounted on said printed circuit board substrate, said component having connecting points;

a plurality of boundary-scan cells, each said boundary-scan cell respectively coupled to one of said connecting point;

a plurality of bypass circuits, each said bypass circuit respectively coupled to one of said of said connecting points, each said bypass circuit including;

signal selection logic having a first input that receives functional output data from said component, a second input that receives test result signals from said boundary-scan cell, a selection signal input, and a selection logic output at which either the functional output data or the test result signals are produced as a function of a selection signal received at said selection signal input; and an output stage having an input coupled to said selection logic output and responsive to a clock transition of a clock signal from said component to produce as component output signals the functional output data provided at the output stage input; said output stage having an output latch having an input coupled to the selection logic output, and a clock input;

an AND gate having a first input that receives a test mode signal indicating whether the boundary-scan cell is in a test mode, a second input that receives a clock signal of the boundary-scan cell, and an output; and an OR gate that has a first input coupled to the AND gate output, a second input coupled to receive the clock signal from the component, and an output coupled to the clock input of the output latch.

2. The circuit board of claim 1, wherein the selection signal input is the test mode signal, the selection logic providing at the selection logic output: the test result signals when the test mode signal indicates that the boundary-scan cell is in the test mode; and the functional output data when the test mode signal indicates that the boundary-scan cell is not in the test mode.

3. The circuit board of claim 1, wherein the selection signal input is a test mode signal that indicates when the boundary-scan cell is in a test mode, the selection logic providing at the selection logic output: the test result signals when the test mode signal indicates that the boundary-scan cell is in the test mode; and the functional output data when the test mode signal indicates that the boundary-scan cell is not in the test mode.

4. The circuit board of claim 1, wherein the selection logic is a multiplexer.

5. A boundary-scan bypass circuit for an electronic component coupled to a boundary-scan call, the bypass circuit comprising:

signal selection logic having a first input that receives component output signals from the electronic component, a second input that receives test result signals from the boundary-scan cell, a selection signal input, and a selection logic output at which either the component output signals or the test result signals are produced as a function of a selection signal received at the selection signal input; and an output stage having an input coupled to the selection logic output, the output stage being responsive to a clock transition of a clock signal from the electronic component to output the component output signals provided to the output stage input, said output stage including:

an output latch having an input coupled to the selection logic output, and a clock input;

an AND gate having a first input that receives a test mode signal indicating whether the boundary-scan cell is in a test mode, a second input that receives a clock signal of the boundary-scan cell, and an output; and an OR gate that has a first input coupled to the AND gate output, a second input coupled to receive the clock signal from the electronic component, and an output coupled to the clock input of the output latch.

6. The bypass circuit of claim 5, wherein the selection signal input is the test mode signal, the selection logic providing at the selection logic output: the test result signals when the test mode signal indicates that the boundary-scan cell is in the test mode; and the component output signals when the test mode signal indicates that the boundary-scan cell is not in the test mode.

7. The bypass circuit of claim 5, wherein the selection signal input is a test mode signal that indicates when the boundary-scan cell is in a test mode, the selection logic providing at the selection logic output: the test result signals when the test mode signal indicates that the boundary-scan cell is in the test mode; and the component output signals when the test mode signal indicates that the boundary-scan cell is not in the test mode.

8. The bypass circuit of claim 5, wherein the selection logic is a multiplexer.

9. A boundary-scan arrangement for a component having connecting points, with at least one of the connecting points being a component output, the arrangement comprising:

a plurality of boundary-scan circuits, each boundary-scan circuit coupled to a different connecting point of the component, with one of said boundary-scan circuits coupled to the component output; and at least one bypass circuit having a data input coupled to the component output and the one of said plurality of boundary-scan circuits that is coupled to the component output, said bypass circuit having a clock input that receives a clock signal from the component, a selection input that receives a selection signal to cause said bypass circuit to selectively output either a signal from the component output or a signal from said one boundary-scan circuit coupled to said bypass circuit, signal selection logic having said data input, said data input including a first input that receives the component output signals from the component and a second input that receives test result signals from said boundary-scan circuit; said selection input; and a selection logic output at which either the component output signals or the boundary-scan circuit signals are produced from the signal selection logic as a function of the selection signal, and an output stage that outputs the component output signal in response to the selection signal indicating the component output signal is to be produced by said bypass circuit and a clock transition of the clock signal from the component, said output stage including:

an output latch having said clock input and an input that is coupled to the selection logic output;

an AND gate having a first input that receives a test mode signal indicating whether the boundary-scan circuit is in a test mode, a second input that receives a clock signal of the boundary-scan circuit, and an output; and an OR gate that has a first input coupled to the AND gate output, a second input coupled to receive the clock signal from the component, and an output coupled to the clock input of the output latch.

10. The arrangement of claim 9, wherein the selection signal input is the test mode signal, the selection logic providing at the selection logic output: the boundary-scan circuit signals when the test mode signal indicates that the boundary-scan circuit is in the test mode; and the component output signals when the test mode signal indicates that the boundary-scan circuit is not in the test mode.

11. The arrangement of claim 9, wherein the selection signal input is a test mode signal that indicates when the boundary-scan circuit is in a test mode, the signal selection logic providing at the selection logic output: the boundary-scan circuit signals when the test mode signal indicates that the boundary-scan circuit is in the test mode; and the component output signals when the test mode signal indicates that the boundary-scan circuit is not in the test mode.

12. The arrangement of claim 9, wherein the signal selection logic is a multiplexer.

13. The arrangement of claim 9, further comprising a plurality of bypass circuits coupled to the component and to separate ones of the boundary-scan circuits.

* * * * *